United States Patent [19]
Dunn

[11] 3,959,782

[45] May 25, 1976

[54] MOS CIRCUIT RECOVERY TIME

[75] Inventor: William C. Dunn, Scottsdale, Ariz.

[73] Assignee: Semi, Inc., Phoenix, Ariz.

[22] Filed: Dec. 4, 1974

[21] Appl. No.: 529,545

[52] U.S. Cl. .............................. 340/173 CA; 320/1
[51] Int. Cl.² ..................... G11C 11/24; G11C 7/00
[58] Field of Search................ 340/173 CA, 173 FF, 340/173 DR; 320/1

[56] References Cited
UNITED STATES PATENTS

| | | |
|---|---|---|
| 3,292,008 | 12/1966 | Rapp .............................. 340/173 FF |
| 3,389,383 | 6/1968 | Burke et al..................... 340/173 FF |

Primary Examiner—Stuart N. Hecker
Attorney, Agent, or Firm—Lindenberg, Freilich, Wasserman, Rosen & Fernandez

[57] ABSTRACT

An MOS device is usually connected to a power supply through an MOS device which is connected so that load current can be supplied to the MOS circuit when it is turned on and leakage current can be supplied thereto when it is turned off. It has been found that the recovery time of such an arrangement upon turn off is substantially longer than the turn on time. This invention provides a method and means for minimizing the recovery time.

5 Claims, 9 Drawing Figures

MOS CIRCUIT RECOVERY TIME

BACKGROUND OF THE INVENTION

This invention relates to MOS circuits and more particularly to improvements therein.

A commonly used circuit arrangement for MOS circuits is one wherein operating current or leakage current is supplied through an MOSFET or other semiconductor devices which are so connected that the current which meets the requirements of the load can pass therethrough. If the load is capacitive, as it usually is, then it is found that the turn on time or rise time of the circuit is usually very much shorter than its turn off time. In other words the recovery time of the circuit is very much longer than its turn on time.

It should be obvious that the speed with which the circuit can be used repetitively is determined by the time required to turn it on and turn it off. For example, if the load is a semiconductor memory, then the cycle time for reading and writing is definitely affected by the time required for the memory system to return to equilibrium after an operation. Accordingly, any arrangement which shortens the recovery time required for such a circuit would improve the rapidity at which circuits of the type indicated can be used.

OBJECTS AND SUMMARY OF THE INVENTION

It is an object of this invention to provide a method and means for reducing the recovery time required for circuits of the type indicated.

It is another object of this invention for enabling MOS ciscuits to be used at a higher speed than has been attained heretofore.

Yet another object of the invention is an improvement which enables the reduction of the recovery time of a node in an MOS circuit and which reduces the power requirements of the MOS circuitry containing that node.

The foregoing and other objects of the invention are achieved by connecting an FET device in parallel with the FET device which is employed to supply load and leakage current to a load, except that this second FET is turned on and off by the application of a pulse to its gate electrode. The second MOSFET is made to have a current handling capacity which is greater, for example, at least ten times greater than the first FET, and is turned on with a signal which is opposite in phase to the input signal which turns the load on and which is applied when the input signal goes off. As a result the "turn off time" of the node may be made at least equal to the "turn on time."

DESCRIPTION OF THE PREFERRED EMBODIMENTS

Figure 1:
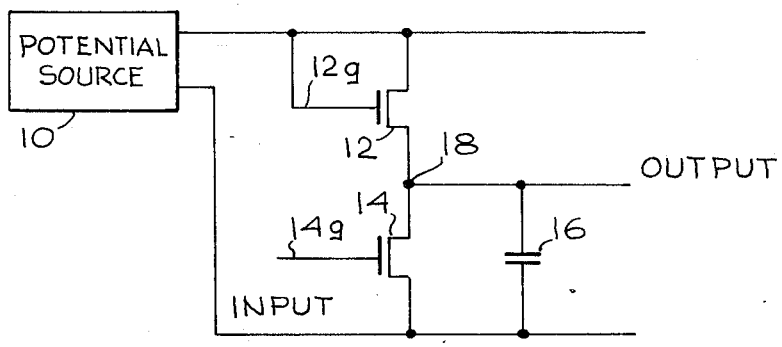
FIG. 1 is a schematic drawing of a known type of inverter circuit shown to provide an understanding of the invention.

FIG. 1 is a circuit diagram of a simple inverter circuit, which is shown to afford a better understanding of this invention. It comprises a potential source 10, and two MOSFETs respectively 12 and 14 connected in series across the potential source. The gate electrode 12a of the MOSFET 12 is connected to the source so that effectively it is always biased on. A load represented by the capacitor 16 is connected across the source and drain of the MOSFET 14. The junction between the drain of the MOSFET 12 and the source of the MOSFET 14 is designated by the reference numeral 18 and it is known as the node.

Figure 2:
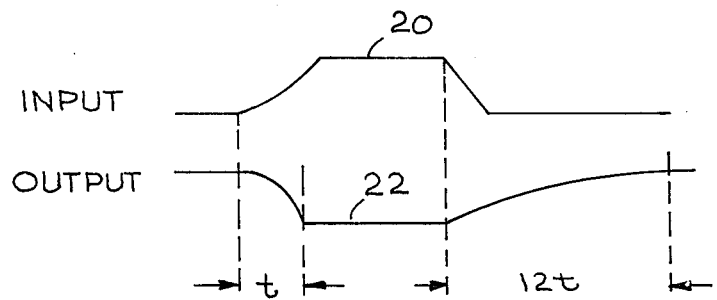
FIG. 2 is a wave shape drawing representing some wave forms which are obtained in the operation of the circuit of FIG. 1.

From DC considerations, the MOSFET 12 is typically one twelfth the size of the MOSFET 14 so that the node 18 has a turn on time constant one twelfth of the turn off time constant, i.e., the inverter will take about 12 times longer to turn off than on. This is represented by the wave form diagram of FIG. 2. The wave form 20 is an input pulse which is applied to the gate 14a of the MOSFET 14. In response thereto, the wave form 22 is produced at the output of the circuit. The rise time or turn on time of the output may be seen to be substantially the same as the turn on time of the input pulse. However, when the pulse 20 is terminated, the output slowly continues afterwards to recover to the quiescent voltage level and turn off. The reason for this is that when the MOSFET 14 is turned on, the capacitor 16 can promptly discharge therethrough. But, when the MOSFET 14 is turned off, because of the limited current handling capacity of the MOSFET 12, a long interval of time is required for recharging the capacitive load.

Figure 3:
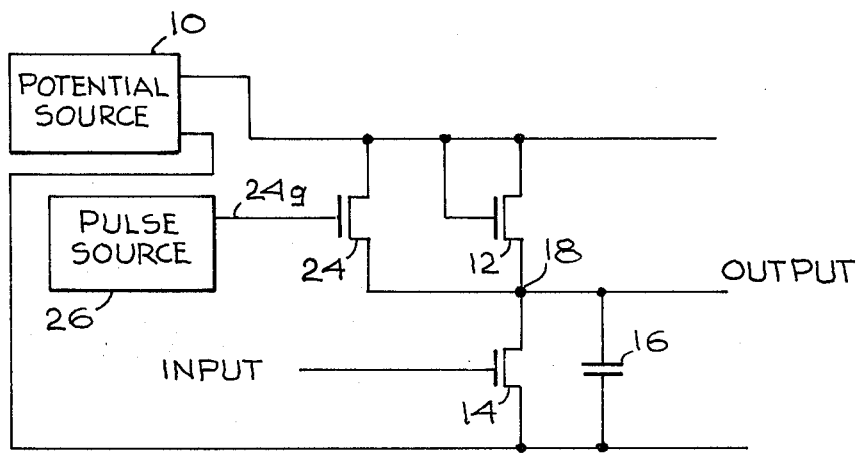
FIG. 3 is a schematic drawing of an inverter circuit which includes an embodiment of this invention.

FIG. 3 shows an embodiment of the invention for curing the problem of overlong recovery time. A MOSFET 24, which may have the same size or current handling ability as MOSFET 14 has its source connected to the potential source and its drain connected to the node 18. A pulse from a pulse source 26 is applied to the gate 24a of the MOSFET, enabling it, at a time when the input pulse is terminated. As a result, the capacitive load 16 can be charged up very quickly through the MOSFET 24.

Figure 4:
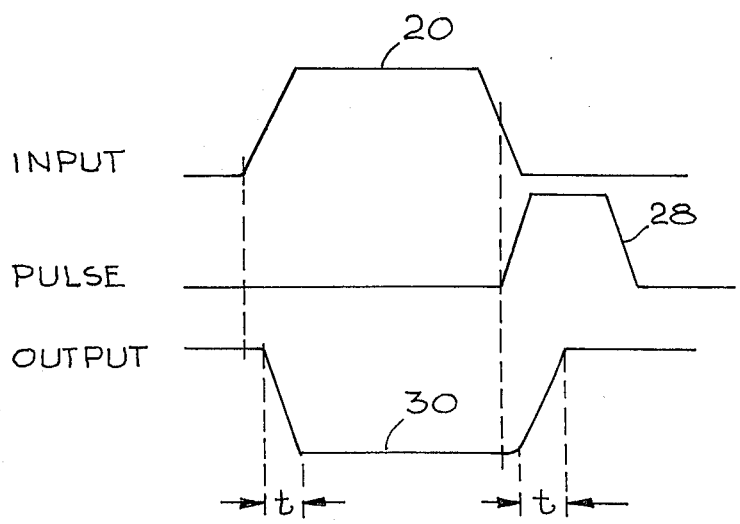
FIG. 4 is a wave shape drawing representing some of the wave forms attained in the operation of the circuit shown in FIG. 3.

Referring now to FIG. 4 there may be seen wave forms which are obtained in the operation of the circuit shown in FIG. 3. The input wave form 20 is the same as in FIG. 2, and a pulse 28 is applied to the gate of the MOSFET 24 at turn off time for the input pulse. As a result, the wave form 30 is provided at the output node 18. It will be seen that the turn off time has the same duration as the turn on time for the output pulse.

An extra benefit, which is obtained with the arrangement shown, is that the size of the MOSFET 12 can now be reduced to a small value, as it only has to supply the leakage current of a node to maintain it in the "high" state. This also reduces the power drain from the power supply and in turn the transition time of the node is improved, as the DC loading on the MOSFET 14 is reduced as a result of the MOSFET 12 being reduced in size.

Figure 5:
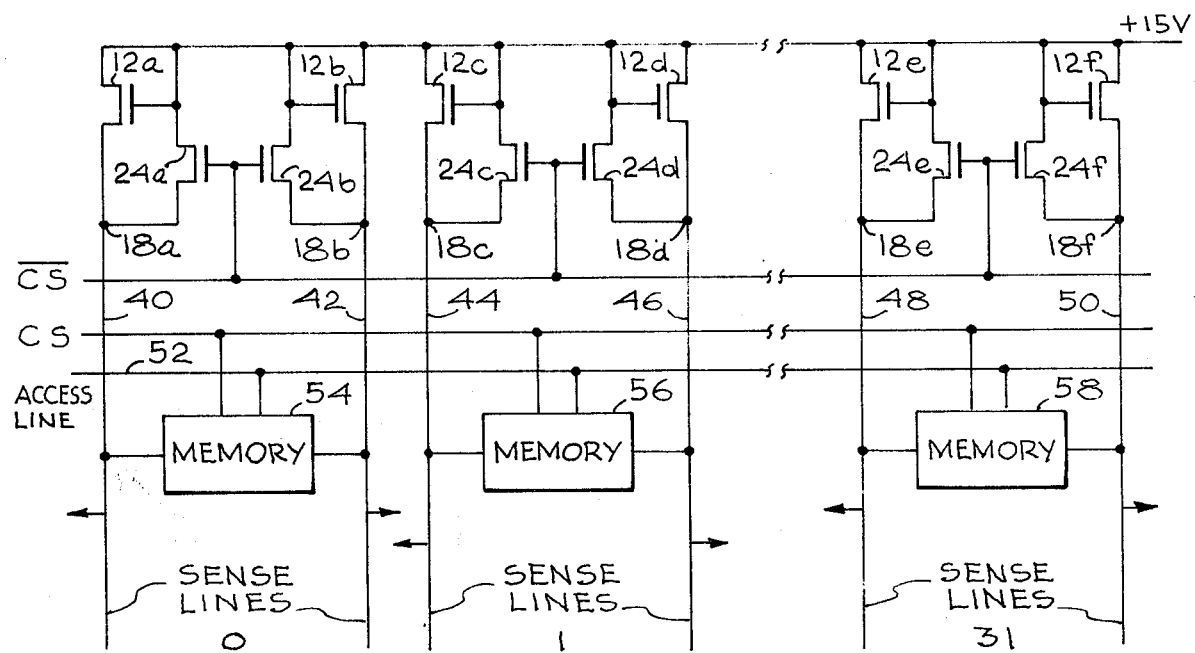
FIG. 5 is a schematic drawing illustrating how the embodiment of the invention may be employed with a semiconductor memory.

FIG. 5 is a schematic arrangement showing how the embodiments of the invention may be applied to a semiconductor memory device to obtain a fast recovery or precharge on the sense lines of said memory. For example a 1K MOS memory is schematically exemplified where 32 pairs of sense lines represented respectively by sense lines 40, 42, 44, 46, and 48 and 50 are used. An access line 52, which selects the particular ones of the memory cells, respectively 54, 56 and 58, to be read from or written into, is driven by a pulse from a source, not shown. Only one of 32 access lines is shown here. The access line pulse is slightly delayed with respect to a CS pulse. The CS pulse is derived from a CS pulse generator, not shown. It is applied to a CS line of which one of 32 is shown. The CS pulse is usually used for reading and for writing in a semiconductor memory in conjunction with an access pulse applied to the access line.

For ease in associating FIG. 5 with the circuit shown in FIG. 3, the MOSFET devices to which the sense lines are connected are given the same reference numerals as those shown in FIG. 3. Accordingly, sense lines 40 and 42 are connected to the nodal points 18a, 18b respectively. Sense lines 44 and 46 are connected to the nodal points 18c and 18d respectively, and sense lines 48 and 50 are connected to the nodal points 18e and 18f respectively. The MOSFETs respectively designated by reference numerals 12a and 24a through 12f and 24f are connected in the same manner as shown in FIG. 3 for the MOSFETs 12 and 24. In this instance, the memory cells respectively, 54, 56, through 58, act as a switch and capacitive load device the same as the MOSFET 14 and capacitor 16 in FIG. 3. That is a memory cell is activated in response to a CS pulse and an access line pulse. The sense lines connected between the memory cells and the nodal points 18a through 18f effectively connect the nodal points to the capacitive load which the lines and the memory cells provide. The pulse which turns on the MOSFETs 24a through 24f is designated as a $\overline{CS}$ pulse and is applied to a line which connects to the gates of all of the MOSFETs 24a through 24f.

Figure 6:
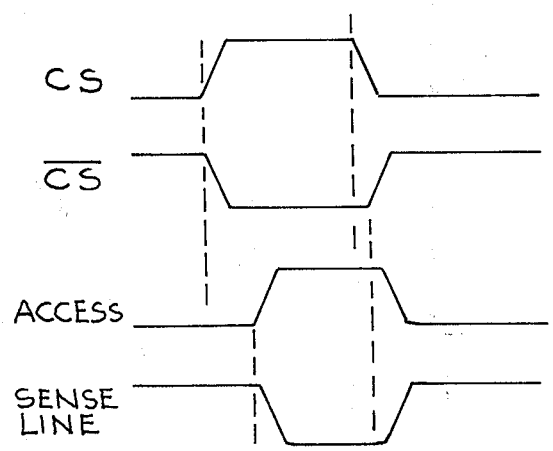
FIG. 6 are wave form drawings illustrating some wave forms which are obtained when the circuit shown in FIG. 5 is operated.
Figure 7:
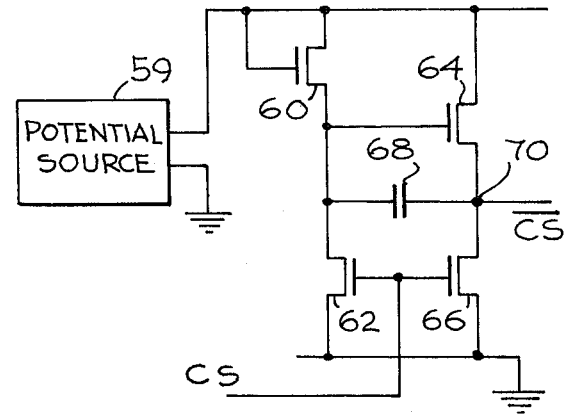
FIG. 7 is a schematic drawing of a $\overline{CS}$ generator.

FIG. 6 shows the CS, $\overline{CS}$ access and sense line wave forms which are obtained when the system shown in FIG. 5 is operated. FIG. 7 is a circuit diagram of a $\overline{CS}$ pulse generator. The pulse generator comprises a potential source 59, and four MOSFETs respectively 60, 62, 64 and 66. MOSFETs 60 and 64 have their source electrodes connected to the positive side of the source of potential and their drain electrodes connected to the source electrodes of the respective MOSFETs 62 and 66. MOSFETs 62 and 66 have their drain electrodes connected to ground. The gate electrode of MOSFET 60 is connected to the positive side of potential source. The gate electrode of MOSFET 64 is connected to the drain electrode of MOSFET 60. The gate electrodes of MOSFETs 62 and 66 are connected together. A capacitor 68 is connected between the drain electrodes of the two FETs 60 and 64 respectively. When a CS pulse is applied from the CS generator (not shown), to the node between the gate electrodes of MOSFETs 62 and 66, the MOSFETs 62, 66 and 68 are rendered conductive. There is a current flow through FETs 64 and 66 whereby a negative going pulse or $\overline{CS}$ pulse is applied to the node 70.

Initially, or in the static mode, the $\overline{CS}$ and access voltages are low so that no DC power is drawn by the CS generator circuit, shown in FIG. 7, or by the memory elements from the sense lines. As may be seen in FIG. 6, when the CS and access voltages go high, the $\overline{CS}$ voltage goes low and the CS generator circuit draws current, for example, about 2 mA from the power supply. Each memory element will pull one of its associated sense lines low, (for example, pulling 0.1 × 32 mA from the supply line). The MOSFETs 24a through 24e are turned off when the $\overline{CS}$ pulse is applied thereto. When the CS and access pulses are terminated so that these voltages go low, the $\overline{CS}$ pulse goes high, turning on the MOSFETs 24a through 24f which supply current to the low sense line causing a quick recovery to the circuit with which the sense line is associated. The only current required at that time is the current required to supply charge to the capacitive load provided by the sense lines connected to the memory cells.

In an embodiment of the invention which was constructed by way of example, and not to serve as a restriction upon the invention, using the improved recovery circuit shown, total current requirement was 5.2 mA during the CS high period and the sense line recovery time is about 30 nanoseconds. Without the recovery circuit the total current requirement was 32 mA during the CS high period and the sense line recovery time was 120 nanoseconds. In addition the sense line high to low transient was improved by about 20% using the recovery circuit in accordance with this invention. The ratio of the sizes or capacities of the FETs 12 and 24 was on the order of 4 to 1.

Figure 8:
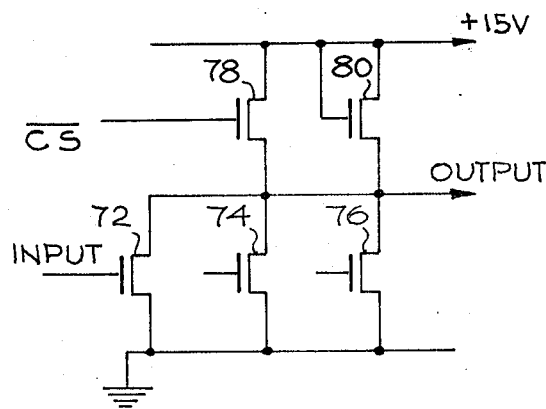
FIG. 8 is a circuit diagram illustrating how an embodiment of this invention may be used with a memory decoder circuit.
Figure 9:
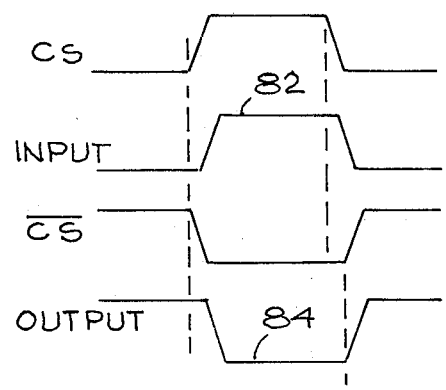
FIG. 9 is a wave form drawing showing some of the wave forms which may be obtained in the operation of the circuit shown in FIG. 7.

Referring now to FIG. 8, there is shown another arrangement for utilizing an embodiment of the invention. This is in connection with a memory decoder circuit which comprises, for example, three MOSFET circuits respectively 72, 74, 76, which are connected in parallel by having their respective drain electrodes connected to ground and their respective source electrodes connected together and to a positive potential source through the MOSFETs respectively 78 and 80. The MOSFETs 72, 74 and 76 serve as a three input NOR gate to an output. The MOSFETs 78 and 80 are connected in the same manner as is shown in FIG. 1. The MOSFET 80 provides leakage charge to the capacitive load provided by the circuits to which it is connected. The MOSFET 78 responds to a $\overline{CS}$ pulse, in the same manner as has been described in connection with the memory system shown in FIG. 5. The $\overline{CS}$, input, CS and output wave forms which occur are shown in FIG. 9. Any of the inputs to the MOSFET 72, 74 or 76, represented by the wave form 82, occur shortly after the CS pulse. The $\overline{CS}$ pulse which constitutes the input to the MOSFET 78 occurs simultaneously with the CS pulse. The output wave form represented by the pulse 84 is supplied to a memory circuit. Termination of the $\overline{CS}$ pulse enables the MOSFET 78 to become conductive thereby charging up the capacitance of the load.

In an embodiment of the invention which was constructed, which was for a 1K memory, 64 of the circuits shown in FIG. 8 were used. Without the use of the recovery MOSFET 78, the circuit required 32 mA of current and had a recovery time of 120 nanoseconds. With the recovery MOSFET 78, the circuit required 8.4 mA of current and had a recovery time of about 25 nanoseconds.

Accordingly, there has been described hereinabove a novel and useful arrangement which permits both a decrease in the recovery time of a node in an MOS circuit and a reduction in the power consumption of the circuit, enabling the circuit to be used more rapidly.

The embodiments of the invention in which an exclusive property or privilege is claimed are defined as follows:

1. In a circuit of the type wherein a first circuit includes a first FET device which is connected in series with a second capacitive type load circuit which is rendered operative in response to a first pulse signal, and current from a current source must pass through said first FET device, to said second circuit,
   means for shortening the recovery time of said second circuit comprising
   a second FET device having a current passing capacity which is large when compared to that of said first FET device, and having source and drain electrodes,
   means for connecting said second FET source and drain electrodes respectively to the source and drain electrodes of said first FET device, and
   means for enabling said second FET device to conduct current when said first pulse signal is being terminated to accelerate the recovery time of said second circuit.

2. In a circuit as recited in claim 1 wherein there is included means for generating a second pulse signal substantially simultaneously with said first pulse signal but of opposite polarity to said first pulse signal, and
   means for applying said second pulse signal to said second FET device to prevent it from conducting current until said first pulse signal is being terminated.

3. In a circuit as recited in claim 1 wherein said first FET comprises a MOSFET device and the current carrying capacity of said second FET device is at least equal to the current carrying capacity of said MOSFET device.

4. In a semiconductor memory system of the type wherein each memory cell stores binary data and there are two sense lines connected to each memory cell wherein one or the other of these sense lines provides a signal, upon readout, indicative of the binary data stored in said cell,
   means for shortening the recovery time of a cell after data readout comprising
   a source of potential,
   for each sense line, a first FET device connected between said source of potential and a sense line for continuously supplying leakage charge thereto,
   for each sense line, a second FET device connected between said source of potential and said sense line for supplying load current, and
   means for rendering said second FET inoperative while reading out of a memory cell connected to a sense line to which said second FET is connected.

5. Apparatus for shortening the recovery time of a signal pulse activated semiconductor circuit comprising a capacitive load comprising
   a source of potential,
   a first FET device connected between said source of potential and said circuit and having a current carrying capability for continuously supplying leakage charge but not load current thereto,
   a second FET device connected between said source of potential and said circuit for supplying load current to said circuit, said second FET device having a current carrying capability for supplying load current to said circuit, and
   means for enabling said second FET circuit to conduct current when said circuit is being inactivated after having been activated.

* * * * *